(12) United States Patent
Feustel et al.

(10) Patent No.: US 7,800,106 B2
(45) Date of Patent: Sep. 21, 2010

(54) TEST STRUCTURE FOR OPC-RELATED SHORTS BETWEEN LINES IN A SEMICONDUCTOR DEVICE

(75) Inventors: Frank Feustel, Dresden (DE); Thomas Werner, Reichenberg (DE); Kai Frohberg, Niederau (DE)

(73) Assignee: Advanced Micro Devices, Inc., Austin, TX (US)

( * ) Notice: Subject to any disclaimer, the term of this patent is extended or adjusted under 35 U.S.C. 154(b) by 350 days.

(21) Appl. No.: 11/747,320

(22) Filed: May 11, 2007

(65) Prior Publication Data

US 2008/0099761 A1 May 1, 2008

(30) Foreign Application Priority Data

Oct. 31, 2006 (DE) .................. 10 2006 051 489

(51) Int. Cl.
*H01L 23/58* (2006.01)
*H01L 29/10* (2006.01)

(52) U.S. Cl. ............ 257/48; 257/E23.179; 257/E21.524
(58) Field of Classification Search .................. 257/48, 257/E23.179, E21.524
See application file for complete search history.

(56) References Cited

U.S. PATENT DOCUMENTS

| | | | | |
|---|---|---|---|---|
| 3,596,269 | A | 7/1971 | Laska | 340/518 |
| 5,485,095 | A | 1/1996 | Bertsch et al. | 324/537 |
| 5,517,107 | A | 5/1996 | Ovens et al. | 324/158.1 |
| 5,561,367 | A | 10/1996 | Goettling et al. | 324/158.1 |
| 5,777,486 | A | 7/1998 | Hsu | 324/763 |
| 5,821,765 | A | 10/1998 | Ling et al. | 324/765 |
| 5,838,161 | A | 11/1998 | Akram et al. | 324/765 |
| 6,111,269 | A | 8/2000 | Moyal | 257/48 |
| 6,312,964 | B1 | 11/2001 | Moyal | 438/18 |
| 6,348,701 | B1 | 2/2002 | Joo et al. | 257/48 |
| 6,351,135 | B1 | 2/2002 | Kim | 324/769 |
| 6,449,749 | B1 * | 9/2002 | Stine | 716/4 |
| 6,531,777 | B1 | 3/2003 | Woo et al. | 257/752 |
| 6,787,800 | B2 * | 9/2004 | Weiland et al. | 257/48 |
| 6,844,751 | B2 | 1/2005 | Marshall et al. | 324/765 |
| 7,001,693 | B2 * | 2/2006 | Liebmann et al. | 430/5 |
| 7,147,976 | B2 * | 12/2006 | Liebmann et al. | 430/5 |
| 7,176,675 | B1 * | 2/2007 | Liegl | 324/158.1 |
| 7,312,003 | B2 * | 12/2007 | Cote et al. | 430/5 |
| 7,356,800 | B2 * | 4/2008 | Stine et al. | 716/21 |

(Continued)

FOREIGN PATENT DOCUMENTS

EP   1 128 424 A2   8/2001

OTHER PUBLICATIONS

German Office Action dated Aug. 7, 2007 for serial No. 10 2006 051 489.0-33.

(Continued)

*Primary Examiner*—Ngan Ngo
(74) *Attorney, Agent, or Firm*—Williams, Morgan & Amerson, P.C.

(57) ABSTRACT

OPC results may be efficiently evaluated on the basis of a test structure containing a plurality of line features with opposing end portions. Thus, for different line parameters, the effect of OPC may be determined for a given critical tip-to-tip distance by determining the leakage behavior of the test assemblies, each having different design parameter values for line width and lateral distance between adjacent lines.

16 Claims, 6 Drawing Sheets

U.S. PATENT DOCUMENTS

| | | | |
|---|---|---|---|
| 7,373,625 B2 * | 5/2008 | Stine et al. | 716/4 |
| 7,392,502 B2 * | 6/2008 | Percin et al. | 716/19 |
| 7,434,197 B1 * | 10/2008 | Dolainsky et al. | 716/19 |
| 7,486,097 B2 * | 2/2009 | Liegl | 324/765 |
| 2002/0089345 A1 | 7/2002 | Doong et al. | 324/765 |
| 2003/0020507 A1 | 1/2003 | Song et al. | 324/763 |
| 2003/0096436 A1 | 5/2003 | Satya et al. | 438/11 |
| 2003/0145292 A1 * | 7/2003 | Stine et al. | 716/4 |
| 2004/0036495 A1 | 2/2004 | Fazekas et al. | 324/765 |
| 2004/0170905 A1 * | 9/2004 | Liebmann et al. | 430/5 |
| 2004/0205688 A1 * | 10/2004 | Pierrat | 716/21 |
| 2005/0091631 A1 * | 4/2005 | Gallatin et al. | 716/20 |
| 2006/0057475 A1 * | 3/2006 | Liebmann et al. | 430/5 |
| 2006/0073686 A1 | 4/2006 | Zach et al. | 438/551 |
| 2006/0110667 A1 * | 5/2006 | Hasegawa et al. | 430/30 |
| 2006/0129968 A1 * | 6/2006 | Pierrat | 716/21 |
| 2006/0138411 A1 * | 6/2006 | Lachenmann et al. | 257/48 |
| 2006/0228041 A1 * | 10/2006 | Joshi | 382/260 |
| 2006/0273242 A1 * | 12/2006 | Hunsche et al. | 250/208.1 |
| 2006/0277506 A1 * | 12/2006 | Stine et al. | 716/4 |
| 2007/0006116 A1 * | 1/2007 | Percin et al. | 716/21 |
| 2007/0118242 A1 * | 5/2007 | Stine et al. | 700/109 |
| 2007/0132445 A1 * | 6/2007 | Liegl | 324/158.1 |
| 2008/0022254 A1 * | 1/2008 | Luo et al. | 716/19 |
| 2008/0072207 A1 * | 3/2008 | Verma et al. | 716/21 |
| 2008/0081385 A1 * | 4/2008 | Marella et al. | 438/14 |
| 2008/0261375 A1 * | 10/2008 | Lucas et al. | 438/400 |
| 2008/0282210 A1 * | 11/2008 | Stine et al. | 716/5 |
| 2008/0295061 A1 * | 11/2008 | Eisenmann et al. | 716/21 |
| 2009/0007030 A1 * | 1/2009 | Nehmadi et al. | 716/4 |
| 2009/0016595 A1 * | 1/2009 | Peterson et al. | 382/144 |
| 2009/0031261 A1 * | 1/2009 | Smith et al. | 716/2 |

OTHER PUBLICATIONS

Translation of Official Communication from German Patent Office for German Patent Application No. 10 2006 025 351.5-33 dated Jan. 2, 2007.

* cited by examiner

TEST STRUCTURE FOR OPC-RELATED SHORTS BETWEEN LINES IN A SEMICONDUCTOR DEVICE

BACKGROUND OF THE INVENTION

1. Field of the Invention

Generally, the present disclosure relates to the field of fabrication of integrated circuits, and, more particularly, to semiconductor devices having conductive lines, such as gate electrodes of field effect transistors, metal lines in the wiring levels of a semiconductor device, which are formed on the basis of advanced photolithography techniques.

2. Description of the Related Art

The fabrication of microstructures, such as integrated circuits, requires tiny regions of precisely controlled size to be formed in a material layer of an appropriate substrate, such as a silicon substrate, a silicon-on-insulator (SOI) substrate, or other suitable carrier materials. These tiny regions of precisely controlled size are generated by patterning the material layer by performing lithography, etch, implantation, deposition processes and the like, wherein typically, at least in a certain stage of the patterning process, a mask layer may be formed over the material layer to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to ultra-violet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etch, implantation, anneal processes and the like.

Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is represented by the lithographic process, in which patterns contained in the photomask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may be 50 nm and even less for currently produced devices, with significantly reduced dimensions for device generations that are currently under development. Similarly, the line width of metal lines provided in the plurality of wiring levels or metallization layers may also have to adapted to the reduced feature sizes in the device layer in order to account for the increased packing density. Consequently, the actual feature dimensions may be well below the wavelength of currently used light sources provided in current lithography systems. For example, in critical lithography steps, an exposure wavelength of 193 nm may be used, which therefore may require complex techniques for finally obtaining resist features having dimensions well below the exposure wavelength. Thus, highly non-linear processes are typically used to obtain dimensions well below the optical resolution. For example, extremely non-linear photoresist materials may be used, in which a desired photochemical reaction may be initiated on the basis of a well-defined threshold so that weakly exposed areas may not substantially change at all, while areas having exceeded the threshold may exhibit a significant variation of their chemical stability with respect to a subsequent development process.

The usage of highly non-linear imaging processes may significantly extend the capability for enhancing the resolution for available lithography tools and resist materials. However, the increased non-linearity may result in significant distortions of the resulting device features compared to the original features provided on the reticle. Lithography processes with low linearity generally suffer, among others, from large line-end pullback, significant corner rounding, a strong dependence between feature area and printed CD (critical dimension), large CD vs. pitch variations.

Figure 1A:
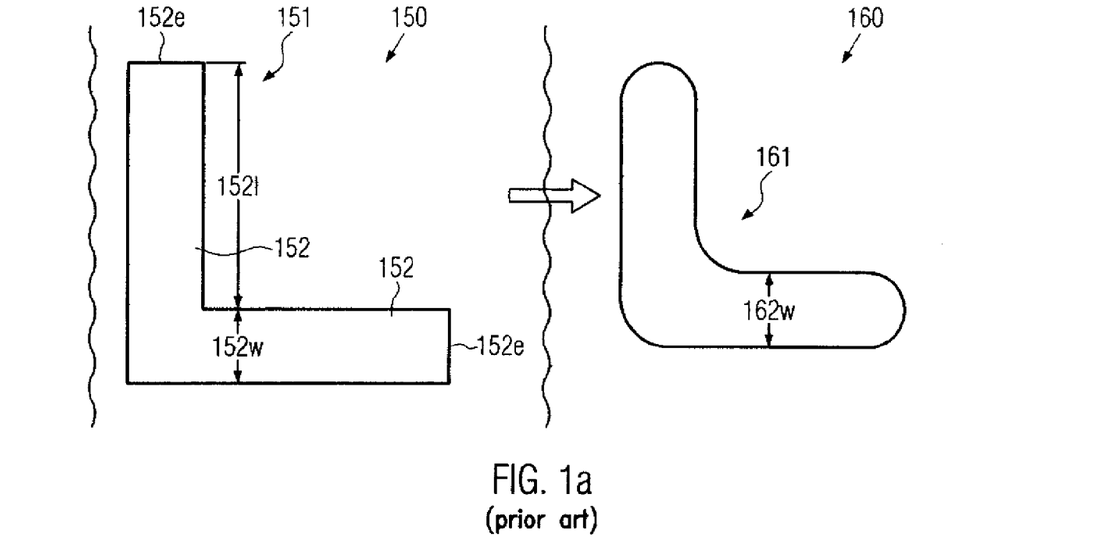
FIG. 1a schematically illustrates line features on a lithography mask and a substrate, respectively, during a non-linear imaging process.

FIG. 1a schematically illustrates a typical feature 151 as provided on a reticle 150 compared to a representation 161 of the actual device feature after imaging the feature onto a resist layer by using a highly non-linear imaging process. As shown, the design feature 151 formed on the reticle 150 may include line-like segments 152 having respective end portions 152c. The respective design dimensions, such as a width 152w and a length 152l, may depend on the technology node used. As previously explained, the width 152w, which may represent the width of a metal line when the feature 151 is designed for a metallization layer of a semiconductor device, or may represent the length of a gate electrode, and the like, may define the final performance of the circuit feature under consideration. The same holds true for the length 152l or the degree of corner rounding, depending on the specifics of the circuit layout of interest. Furthermore, the neighborhood of the feature 151, as well as the local process conditions, may also significantly affect the imaging process. Thus, the finally obtained result of the imaging process may locally vary on the wafer with respect to the local conditions prevailing during the imaging process and the layout of the reticle in the vicinity of the feature 151.

The reticle 150 may typically be comprised of an opaque material, such as chromium, possibly in combination with other materials, that is formed on an appropriate substrate material, which is substantially transmissive for the exposure wavelength under consideration. In other cases, the reticle may represent a reflective mask, wherein the reflectivity is appropriately modified so as to represent the desired features 151. The features 151 are formed by advanced mask print techniques based on optical lithography, electron beam lithography and the like.

The reticle 150 may then be used as a mask during an optical lithography process to obtain a latent image in a corresponding resist material that is provided on a substrate, such as a semiconductor wafer, on the basis of complex pre- and post-exposure treatments. The latent image in the resist material is then developed to form a resist feature that may correspond to the feature 151, or at least a perform thereof, if further trim processes may be required for further reducing the dimensions of the resist feature prior to actually forming a permanent device feature on the basis of the resist feature. For convenience, it may be assumed that the device feature 161 may represent the finally obtained feature on the basis of the design feature 151 in combination with a highly non-linear imaging process. As shown, a significant degree of corner rounding may be obtained and also a "pull back" of the line ends may be observed. That is, the end portions 152e may be rounded and may be "withdrawn" compared to the desired design dimensions. It should be appreciated that the dimensions of the feature 161 formed on a substrate 161 may generally be reduced by the projection factor defined by the optical projection system used for performing the imaging process. For example, for a desired width 162w of 100 nm, the corresponding width 152w may be approximately 500 nm, when the imaging optics provides a reduction factor of 5. However, due to the respective distortion of the feature 161 relative to the design feature 151, significant corrections are usually provided on the reticle side in order to reduce the non-linearity. Such corrections upon reticle design may be referred to as optical proximity corrections (OPC), which may have to performed more aggressively with an increasing degree of non-linearity of the imaging process. Consequently, OPC corrections used to compensate for undesired pattern deformation in processes of high non-linearity must simultaneously provide significant yet highly precise corrections to the mask design of the reticle 150. These corrections may be performed on the basis of complex OPC models, which may locally simulate the imaging process for a given pattern in order to determine appropriate corrections for the mask layout of the pattern under consideration to remove or reduce the undesired effects of the non-linear imaging process. Due to the highly local nature of the non-linearity effects, great efforts are required in terms of computational resources and the capacity of the design databases for performing OPC corrections and redesigning the corresponding reticles on the basis of the corrections. In many cases, however, the corrections provided by the OPC tool may themselves result in non-desired modifications of the finally obtained device features.

Figure 1B:
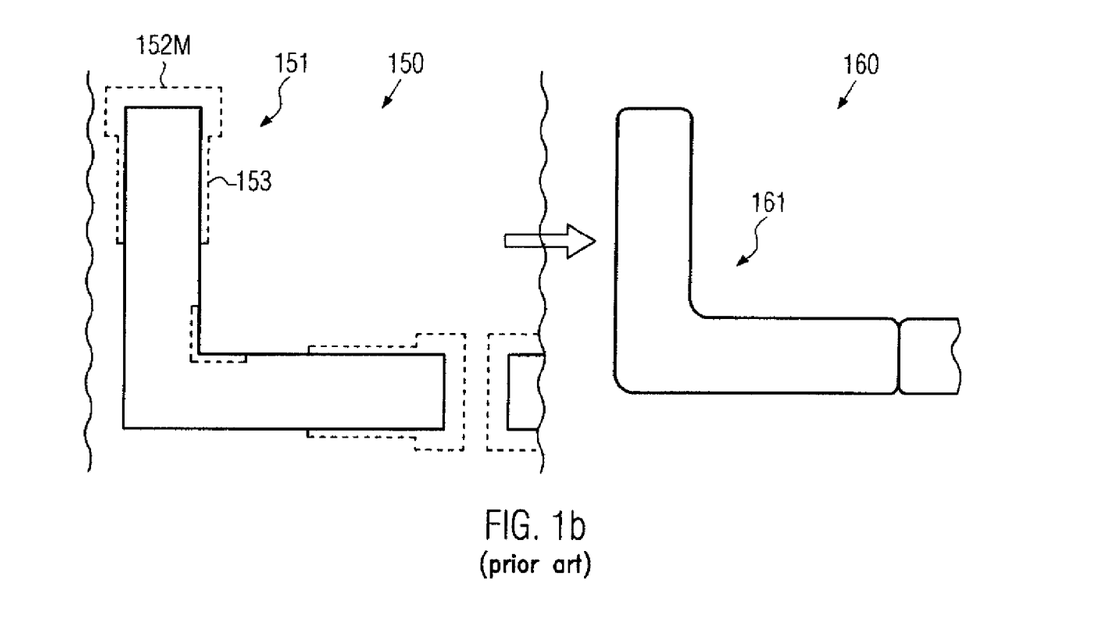
FIG. 1b schematically illustrates the line features on a lithography mask and a substrate, respectively, when using an OPC correction process.

FIG. 1b schematically illustrates the feature 151 formed on the reticle 150 on the basis of OPC corrections 153, which are illustrated in dashed lines. For example, respective modified end portions 152M may provide a reduction of the undesired pull back of the end portions 151e. The resulting features 161 may have a size and shape that substantially corresponds to the design values. However, due to limitations of the OPC model, such as restricted design databases, computational resources or other process conditions that may not be precisely incorporated into the respective model, the corrections may locally provide faulty device features. For instance, the modified end portions 152M may result in a corresponding short between opposing line end portions, which cause severe performance degradations or even a complete failure of the device under consideration.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for determining the characteristics of OPC-related influences on the lithography process for forming specific structures, such as metallization structures, of semiconductor devices by assessing respective test assemblies or patterns in view of leakage current. For this purpose, a plurality of test patterns having different values with respect to OPC critical design parameters may be electrically coupled to obtain an electric output signal that may be used for evaluating the imaging process including the OPC correction mechanism. As previously explained, respective end portions of line features, such as metal lines, gate electrodes and the like, are subject to significant OPC corrections in order to reduce line end pull back caused by highly non-linear imaging processes. Thus, by monitoring the respective line features for a plurality of different conditions, which may be represented by varying parameter values for critical design parameters, on the basis of electrical test procedures, a highly efficient evaluation of the OPC model used in redesigning respective masks and reticles may be accomplished.

According to one illustrative embodiment disclosed herein, an OPC test structure comprises a substrate and a plurality of test assemblies formed on the substrate on the basis of an OPC process. Each test assembly comprises a plurality of first line features and a plurality of second line features, wherein the first and second line features have a spatial design relationship for electrically insulating the plurality of first line features from the plurality of second line features. To this end, the spatial design relationship is defined by at least one design dimension having a different design value for each of the plurality of test assemblies. Furthermore, an interconnect structure is formed above the substrate and connects the plurality of test assemblies so as to identify at least one of the test assemblies comprising a short current path between the first and second line features of the at least one test assembly.

According to another illustrative embodiment disclosed herein, a test structure comprises a substrate and a plurality of test assemblies formed on the substrate on the basis of an OPC (optical proximity correction) process. Each of the plurality of test assemblies comprises a different value combination for at least two design dimensions of line features formed in each of the plurality of test assemblies.

According to yet another illustrative embodiment disclosed herein, a method comprises forming a test structure above a substrate by a manufacturing process sequence including an OPC process and based on process recipes and design rules for a specified device level of a semiconductor device, wherein the test structure comprises a plurality of test assemblies with line features. The method further comprises evaluating the OPC process by determining the leakage behavior of the line features in the plurality of test assemblies.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to the assessment of design criteria and process flow parameters for the fabrication of line features for advanced semi-conductor devices. As previously pointed out, the highly non-linear nature of the imaging process for feature elements, such as lines in metallization structures, gate electrodes and the like, of integrated circuits, micromechanical devices and the like for advanced applications requires a thorough monitoring and controlling of design rules, such as critical dimensions, distances between neighboring circuit elements and the like, in order to detect and/or evaluate the characteristics of the imaging process. Consequently, the subject matter disclosed herein provides respective control and monitoring mechanisms, such as respective test structures formed on dedicated test substrates or on product substrates at specific substrate locations on the basis of OPC corrected imaging processes, wherein electric measurement data may enable an efficient assessment of OPC-related parameters. By appropriately providing a representative set of process conditions, the OPC mechanism may operate on the test structure so that the corresponding result may then be determined on the basis of electric leakage measurements. With respect to the leakage behavior of line features, such as metal lines, polysilicon lines and the like, a very efficient technique is the determination of the presence of a conductive path between adjacent features within a specified test pattern, which may, for instance, include a plurality of individual components of metal lines and the like.

For example, the modification of line end portions by OPC mechanisms may be efficiently monitored by providing an appropriately designed leakage test structure having a plurality of test assemblies or test patterns, which may be tested with respect to at least one OPC-related characteristic in a substantially "simultaneous" manner on the basis of a low number of probe pads. Thus, substrate area required in semiconductor devices and reticles may be maintained at a low level by connecting the plurality of test patterns or assemblies to the probe pads so as to allow a concurrent estimation of the OPC efficiency, wherein, in some illustrative embodiments, at least the occurrence of at least one critical process condition may be detected on the basis of only two probe pads. In other illustrative embodiments, additional information may be gathered by providing a resistive network, thereby enabling the identification of specific process and design conditions that may have a high probability of causing OPC-related local short circuits in actual devices. In this case, the respective test patterns or assemblies may be considered as "switches" so that, by appropriately arranging the resistor network, a high degree of information may be obtained concurrently, even if only two probe pads may be used for obtaining a respective measurement signal. Consequently, a systematic examination of specific OPC-related parameters, such as the tip-to-tip distance of line features for varying conditions, may be accomplished on the basis of a single test structure having a significantly reduced number of probe pads.

It should be appreciated that the subject matter disclosed herein is highly advantageous in the context of advanced semiconductor devices, such as integrated circuits having line features, such as metal lines of a metallization structure on the basis of copper and low-k dielectric materials, since here feature sizes are steadily decreased, thereby also imposing increasingly restrictive process margins on the respective process flows for forming metallization structures. It should be appreciated, however, that the principles disclosed herein may also be applied to leakage tests in any semiconductor devices, irrespective of the specific manufacturing flow and the materials used. For example, the pull back of line ends of polysilicon lines and the OPC-related issues of obtaining local leakage paths may also be efficiently evaluated on the basis of the principles disclosed herein. Consequently, unless specifically pointed out in the specification and/or the appended claims, the present invention should not be considered as being restricted to a specific manufacturing technique and a specific type of semiconductor device.

Figure 2A:
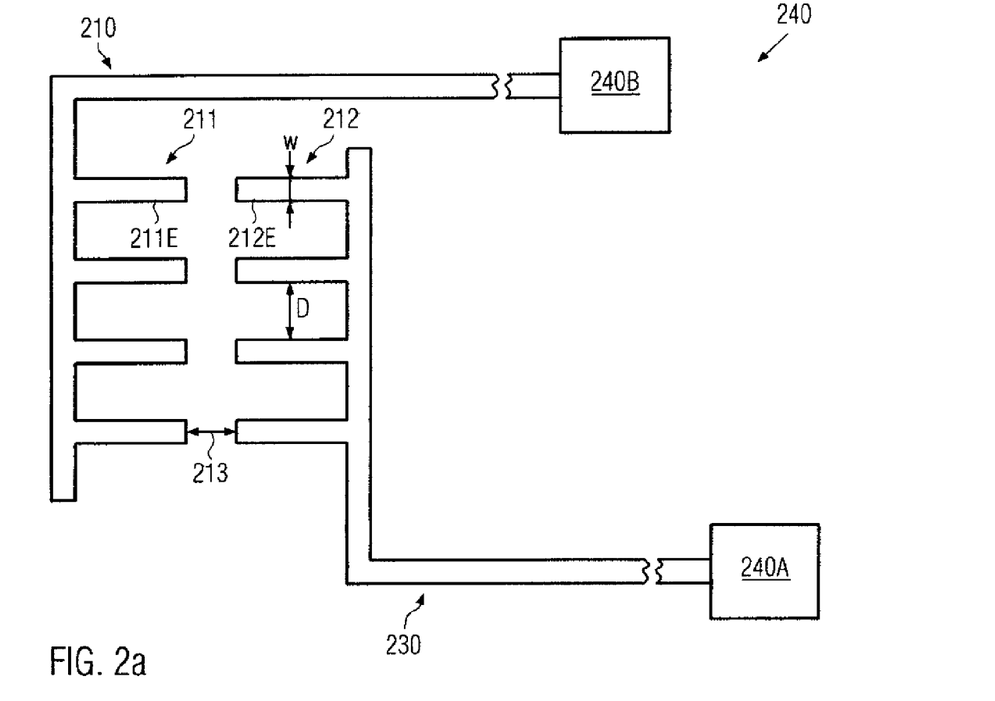
FIG. 2a schematically depicts a top view of a base assembly of a test structure for evaluating the local behavior of an OPC process on the basis of leakage currents according to illustrative embodiments disclosed herein.

FIG. 2a schematically illustrates a top view of a basic test assembly or test pattern 210 for efficiently estimating the performance of an OPC mechanism with respect to varying process conditions. As previously explained, OPC correction mechanisms may add respective corrections in the form of so-called "hammer heads" at line end portions in the layout of the lithography mask or reticle in order to compensate for non-linearities of the imaging process. Since the size and shape of the corresponding modifications of the line end portions may critically depend on a plurality of conditions, such as the pattern density, the location of the line within the exposure field, the design dimensions of the base feature and the like, the OPC model may not provide acceptable corrections for every situation, which may result in respective shorts of opposing line end portions, as is previously explained. Thus, the test assembly 210 may include a plurality of first line features 211 and a plurality of second line features 212, each of the first and second line features 211, 212 having a respective end portion 211E, 212E, respectively, which may be positioned so as to be spaced apart, at least in the ideal layout under consideration, by a specified spacing 213. Other design dimensions or parameters may be a line width W of the line features 211, 212, wherein it should be appreciated that the line width W refers to a design width prior to an OPC correction, which may respectively modify the width W, in particular at the respective end portions 211E, 212E, depending on the predictions of the respective OPC model. A further critical design parameter may be the distance D of laterally adjacent line features 211 or 212. While the spacing 213 may be an important design dimension with respect to package density, device performance and the like which may have to be observed, the parameter values W, D may represent specific process situations under which the OPC mechanism may have to operate so as to provide the desired spacing 213 while efficiently reducing the effects of the non-linear imaging process. Consequently, by varying these values of the parameters W and D, the operational behavior of the OPC mechanism may be monitored by detecting whether or not a leakage path, that is, a short circuit, has been obtained after actually designing a mask having the test assembly 210 and performing a lithography process. For performing an electric test on the basis of a plurality of test assemblies 210, an appropriate interconnect structure 230 may be provided that provides the electric connection of the test assembly to respective probe pads 240, wherein, in some illustrative embodiments, not more than two pads 240A, 240B may be provided, as will be described later on in more detail. It should be appreciated that the interconnect structure 230, or at least portions thereof, and the probe pads 240 may not necessarily be formed in the same device level as the line features 211, 212, depending on the complexity of the test assembly 210.

Figure 2B:
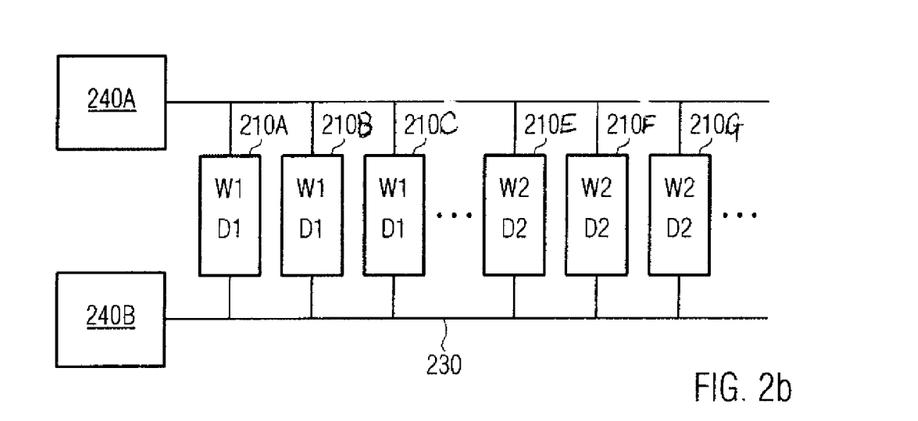
FIG. 2b schematically illustrates a test structure including a plurality of test assemblies for identifying inefficiencies of the OPC process according to illustrative embodiments disclosed herein.

FIG. 2b schematically illustrates a test structure 200 comprising a plurality of test assemblies 210A . . . 210G, collectively referred to as test assemblies 210, wherein at least some of the test assemblies 210 differ from each other in at least one parameter value related to OPC characteristics. In one illustrative embodiment, each of the test assemblies 210 may include the respective line features 211, 212 with an appropriately selected design value for the width W and distance D. For example, a set of values W1 . . . Wn and D1 . . . Dm may be established for the parameters W and D in order to cover a desired range of design and process conditions. Since it may be difficult to determine a priori, the final result after the OPC mechanism for the various values, each possible combination (Wx, Dy) with x=1 . . . n and y=1 . . . m for W and D may be provided in the test structure 200 by forming each test assembly on the basis of a respective different combination of W and D values. For example, the values D1, D2, D3 may be varied according to a sequence starting with the minimum design distance for D1 and using D2=1.5×D1, D3=2×D1, etc. Similarly, W1 may represent the minimum design width, W2=1.5×W1, W3=2×W1, etc. It should be appreciated that these values represent exemplary values for appropriately covering the respective value ranges. Thus, other values and increments may be used.

After forming the test structure 200 on a substrate for a lithography mask or reticle using OPC mechanisms, resulting in modifications depending on the model-predicted or otherwise calculated behavior of the imaging process under consideration, the test structure 200 may be transferred to a substrate used for fabricating semiconductor devices, such as integrated circuits, using the imaging process and respective post-lithography processes, as will described later on in more detail. For example, the test structure 200 may be formed on dedicated test substrates and/or on test sites of product substrates. Thereafter, the test structure 200 may be used for estimating the imaging process by determining the presence of a leakage current in the test structure 200. For this purpose, the resistance of the test structure 200 may be determined on the basis of the probe pads 240A, 240B using any appropriate external measurement device. Detecting an increased leakage current may provide an indication for a corresponding high probability for an inefficiency of the OPC mechanism.

Figure 2C:
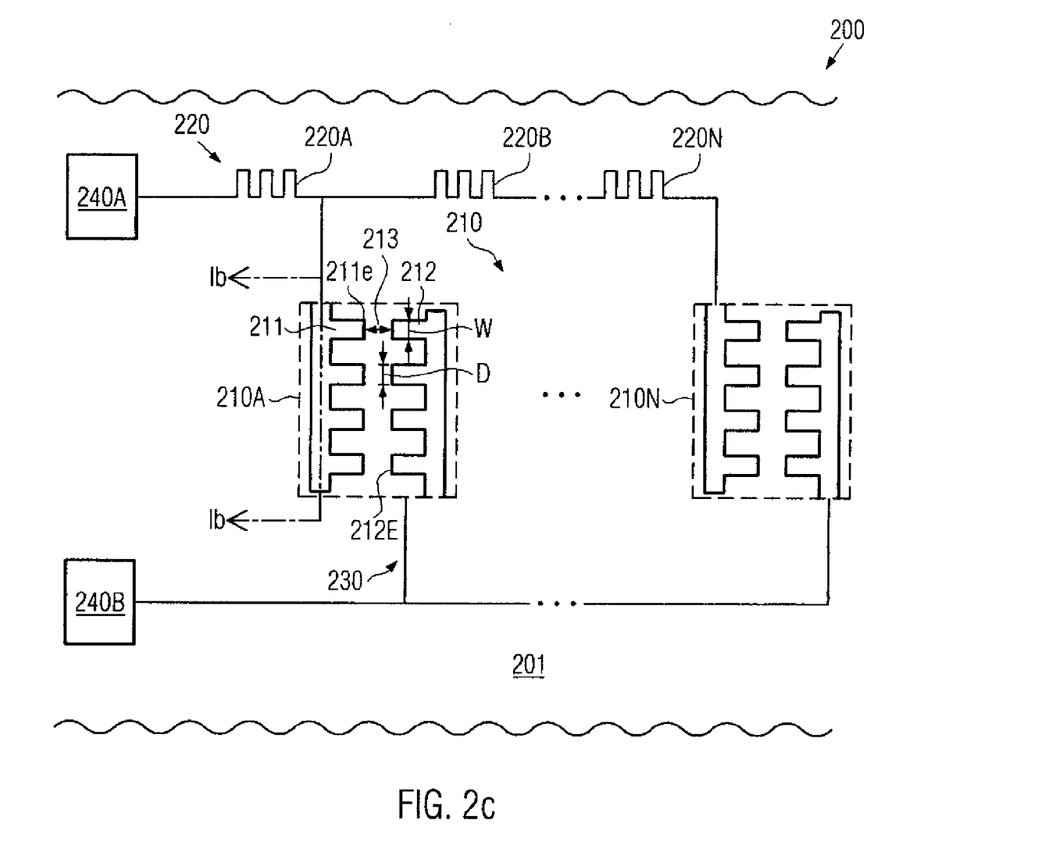
FIG. 2c schematically illustrates a top view of a test structure comprising a plurality of test patterns or assemblies and a resistive network, the leakage status of which may be obtained on the basis of two probe pads, in accordance with illustrative embodiments disclosed herein.

FIG. 2c schematically illustrates a top view of the test structure 200 according to further embodiments for obtaining an increased amount of information. In the embodiment illustrated in FIG. 2c, the test structure 200 may comprise a substrate 201, which may represent, in one illustrative embodiment, any appropriate substrate for forming thereabove a metallization structure of a semiconductor device. For instance, the substrate 201 may represent a bulk semiconductor substrate, such as a silicon substrate or an SOI substrate, or any other appropriate carrier having formed thereon a required material layer, such as a semiconductor layer, which may be used for forming circuit elements therein, as will be described later on in more detail. In some illustrative embodiments, the substrate 201 may represent a product substrate having formed thereon a plurality of semiconductor devices, such as integrated circuits, located at dedicated positions, wherein the test structure 200 may be formed on an appropriate position, such as a scribe lane and the like. The test structure 200 may further comprise the plurality of test assemblies or test patterns 210, such as 210A, 210B . . . 210N, wherein the number of test patterns may vary from two test patterns to any appropriate number. Each of the test patterns 210A . . . 210N may comprise an appropriate assembly of metallization structure components, such as metal line features, used to estimate leakage currents generated during operation of the test structure 200. In some embodiments, additional components, such as circuit elements, may be included in the test patterns or assemblies 210. Hence, the term test pattern or test assembly is to enclose any composition of features required to define the electric response upon occurrence of a pronounced leakage path in one of the line features that may be functionally associated with a respective one of the test patterns 210. Thus, the term "test pattern" should not be restricted to metallization features within a single metallization layer unless otherwise set forth in the specification or the appended claims. In some embodiments, the line features 211, 212 are arranged according to a desired tip-to-tip spacing 213, while varying the parameters W and D. It should be appreciated, however, that the specific arrangement of the components 211, 212 in the respective test patterns 210A . . . 210N may be selected in accordance with any specific criterion in order to obtain information with respect to the OPC characteristics.

The test structure 200 may further comprise a plurality of circuit elements 220, wherein, in the illustrative embodiment shown, the circuit elements 220A . . . 220N may be provided in the form of resistors, wherein the respective resistors 220A . . . 220N may have a resistance value that is significantly higher than a corresponding resistance of one of the test patterns 210A . . . 210N when a corresponding leakage path may be created therein. For example, an appropriate resistance value for the respective resistors 220A . . . 220N may range from several kilo ohms to several hundred kilo ohms. In some illustrative embodiments, the circuit elements 220 may be provided as substantially identical elements, i.e., having substantially the same resistance value, thereby reducing the design complexity, since identical circuit patterns may be used for the respective circuit elements 220. In still other illustrative embodiments, the resistance values of at least some of the resistors 220A . . . 220N may differ from each other. The test structure 200 may further comprise the interconnect structure 230, which is, for convenience, indicated in the form of lines in the drawings, wherein it should be appreciated that the interconnect structure 230 may comprise any metal lines, polysilicon lines, vias and contacts as required. Hence, the interconnect structure 230 may be configured so as to connect the plurality of circuit elements 220 and the plurality of test patterns 210A . . . 210N according to a specified circuit layout, wherein the interconnect structure 230 also connects the resulting circuitry to the probe pads 240A, 240B, wherein, in the illustrative example shown, only two probe pads may be provided for the test structure 200. As previously explained, the probe pads 240A, 240B may require a significant substrate area since these pads have to be designed so as to allow access by an external probe for connecting the test structure 200 to an external measurement device.

Figure 2D:
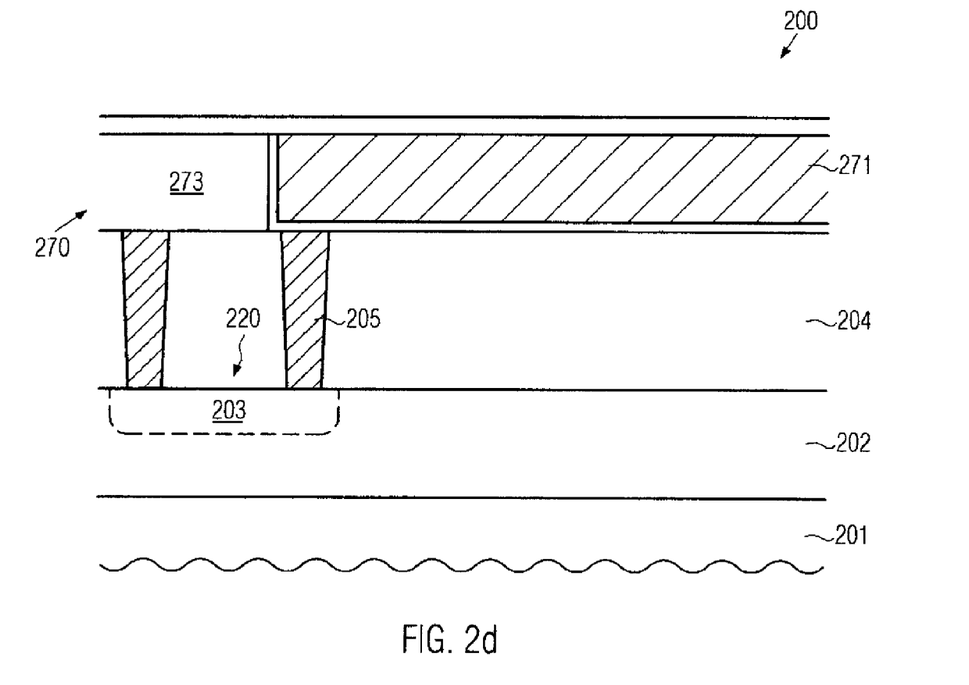
FIG. 2d schematically illustrates a cross-sectional view of a portion of the test structure of FIG. 2c according to illustrative embodiments disclosed herein.

FIG. 2d schematically illustrates a cross-sectional view through a portion of the test structure 200 as shown in FIG. 2c. It should be appreciated that the top view as shown in FIG. 2c is provided as a mixture of an actual top view and a functional diagram in order to more clearly demonstrate the principles disclosed herein. In an actual configuration, the various components may be positioned quite differently and may also be formed in different device levels, as will be illustratively described with reference to FIG. 2d. Thus, the test structure 200 may comprise the substrate 201, which may have formed thereon a device layer 202, such as a semiconductor layer, in which may be formed the plurality of circuit elements 220 and in which may be formed other circuit elements, such as transistors, capacitors and the like, when additional test circuitry or actual product devices are also formed above the substrate 201. In this example, it may be assumed that the circuit elements, acting as resistors 220A . . . 220N, may be provided in the form of respective circuit elements, such as transistors having a moderately high on resistance, or, as shown, the circuit elements 220 may be provided in the form of a moderately low doped semiconductor region 203. In other cases, the respective circuit elements 220 may be provided in the form of semiconductor lines of different lengths, different dopant concentration and the like. It should be appreciated that the circuit elements 220 may be formed in accordance with well-established process techniques as typically used for manufacturing semiconductor devices.

Furthermore, an interlayer dielectric material 204 is provided, in which may be formed respective contacts 205 that may be considered as components of the interconnect structure 230. A metallization structure 270 may be provided, which may comprise a metal line 271 embedded into a dielectric material 273. The metal line 271 may represent a portion of the interconnect structure 230 or may represent a metal line connecting to the line features 211 (not shown). If the test structure 200 may be used after forming a plurality of metallization layers, such as the layer 270, one or more metallization layers may be provided and may include portions of the interconnect structure and of the probe pads 240 (not shown). For example, if the test structure 200 is provided in a product substrate, the respective current path for measurement signals from the respective test patterns 210A . . . 210N to the probe pads 240A, 240B via the circuit elements 220 may extend through the entire metallization structure.

A typical process flow for forming the test structure 200 shown in FIG. 2d may comprise any appropriate manufacturing techniques, wherein at least the metallization layer 270, including the line features 211, 212, is formed on the basis of a specified manufacturing sequence based on the OPC mechanism for providing the structure 200 first in a respective reticle or lithography mask in order to estimate one or more process parameters or estimate a design parameter related to OPC characteristics.

Again referring to FIG. 2c, as previously explained, in the circuit arrangement as shown, the various test patterns 210A . . . 210N may be arranged to cover a desired plurality of design parameter value ranges with respect to OPC specifics that are to evaluated on the basis of a leakage failure during the specified manufacturing sequence. For instance, for a minimum distance 213 defined in the test patterns 210, the risk of generating a short circuit between opposing end portions 211E, 212E may depend on unknown conditions due to, for instance, limitations of the OPC models used. Consequently, a reliable estimation of the OPC model for the desired minimum spacing 213 may have to be determined. For this purpose, a test structure 200 may be operated by, for instance, connecting the probe pads 240A, 240B to an external measurement device, such as a resistance measurement device, in order to estimate the total resistance of the test structure 200. Since each of the test patterns 210A, 210N is connected in series with a respective resistor 220A . . . 220N, a leakage current failure, for instance in the last test pattern 210N, having a specified combination (Wx, Dy), may therefore result in a total resistance value in the test pattern 200 that substantially equals the sum of the resistances of the resistors 220 not "shunted" by a respective leakage path. The corresponding value may be obtained by a respective measurement signal obtained via the probe pads 240A, 240B with a value that, in this example, is substantially the sum of all resistors 220A . . . 220N, since it may be assumed that the resistance of the "shorted" test pattern 210N is significantly lower compared to the resistance values of the resistors 220A . . . 220N. Similarly, if one of the test patterns arranged "in front of" the test pattern 210N exhibits a failure, for instance the test pattern 210B may have a short circuit, the total resistance value for this state of the test structure 200 obtained via the measurement signal at the probe pads 240A, 240B may substantially yield the resistance value of the resistors 220A, 220B. Since the respective resistance values may be known in advance, the corresponding total value during the test procedure may indicate which of the test patterns 210A ... 210N has failed. Consequently, by providing a series circuit of the resistors 220 in the respective test pattern, wherein a first pair of resistor and test pattern is connected between the probe pads 240A, 240B and subsequent pairs of a resistor and a test pattern are connected to the probe pad 240B and to a node defined by a contact area between a preceding pair of resistor and test pattern, the respective test pattern producing a respective leakage failure may be identified.

Figure 2E:
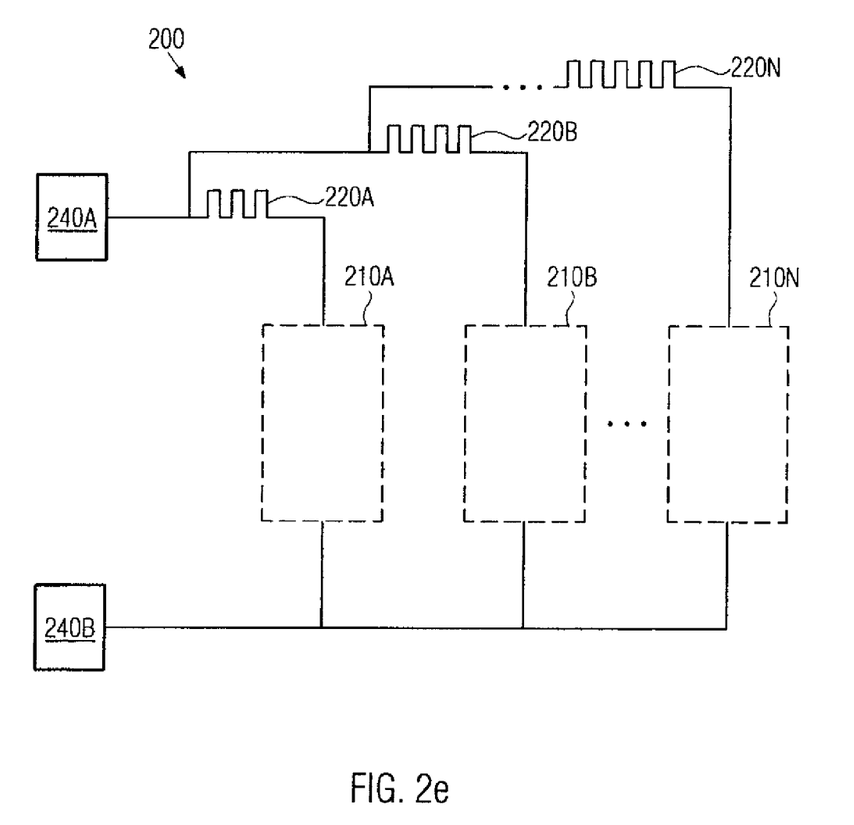
FIGS. 2e-2f schematically illustrate top views of respective test structures including a resistor network for obtaining an increased amount of information by a single measurement in accordance with yet other illustrative embodiments disclosed herein.

FIG. 2e schematically illustrates a further circuit arrangement of the test structure 200 in accordance with further illustrative embodiments, wherein a respective leakage failure in one of the test patterns may be identified in order to provide additional information on the OPC mechanism. In the embodiment shown, each test pattern 210A ... 210N may be connected in series with a respective one of the resistors 220A ... 220N, which, in the present embodiment, may have different resistance values, which may, however, again be selected sufficiently high compared to a respective leakage failure occurring in one or more of the test patterns 210A ... 210N. Respective different resistance values may be readily obtained on the basis of respective manufacturing techniques, wherein, for instance, a plurality of unit resistor elements in the device level may be appropriately connected so as to obtain the desired different resistance values for the resistors 220A ... 220N. Moreover, the test patterns 210A ... 210N may have formed therein any appropriate arrangement of metallization components, wherein the same parameter or design dimension may not necessarily be assessed. For example, the test patterns 210A ... 210N may comprise a plurality of patterns as shown in FIG. 2a and may additionally comprise other test pattern arrangements in which other critical parameters may be estimated, such as the spacing 213 (FIG. 2a).

During operation of the test structure 200 as shown in FIG. 2e, one or more of the test patterns 210 may have a leakage failure. For instance, it may be assumed that the first test pattern 210A and the last test pattern 210N may have a leakage failure due to, for instance, respective non-ideal OPC corrections. Since the respective resistance values of the "shorted" test patterns 210A, 210N are significantly less compared to the respective resistance values of the resistors 220A, 220N, the "result pattern" obtained in this case yields a parallel circuit for the resistors 220A and 220N. Consequently, a respective total resistance value may be determined via the probe pads 240A, 240B, wherein, from the corresponding total resistance value, the result pattern may be recalculated based on the known resistance values of the resistors 220A ... 220N. For example, respective resistance values may be selected for the resistors 220A ... 220N such that, for each possible configuration of leakage paths in the test patterns 210, a unique total resistance value is generated. From the respective total value, the respective result pattern associated with the value may then be readily identified. Consequently, a high degree of flexibility for monitoring leakage failures in the respective test patterns may be obtained, thereby providing the potential for efficiently assessing the OPC behavior for a plurality of different local design situations.

Figure 2F:
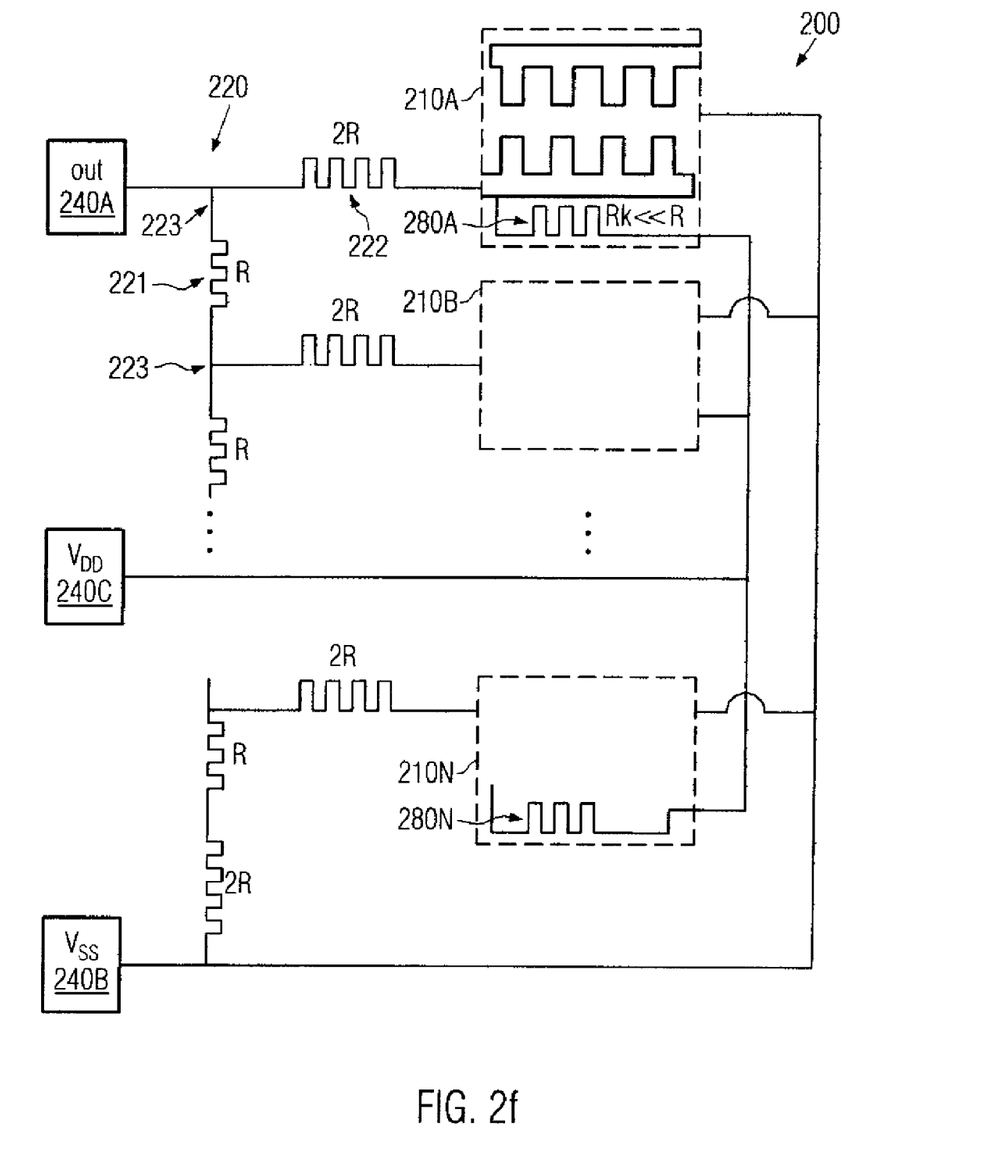

FIG. 2f schematically illustrates the test structure 200 according to other illustrative embodiments. The test structure 200 may comprise the plurality of resistors 220, which may be connected so as to form a network that enables the identification of a plurality of different result patterns of the respective test patterns 210A ... 210N irrespective of whether one or more of the test patterns 210 has a leakage current failure. Furthermore, the test patterns 210A ... 210N may have similar or quite different configurations with respect to the varied design values so that the respective probabilities for suffering from a leakage current failure may also be uncorrelated between the plurality of test patterns 210A ... 210N. In this arrangement, the plurality of resistors 220 may comprise a plurality of n resistors 221 having a resistance value of R, and a plurality of n+1 resistors 222 having a resistance value of 2 R. As illustrated, the n resistors 221 and a single resistor 222 form a series of resistors connected between the probe pads 240A, 240B. Furthermore, each of the test patterns 210A ... 210N is connected in series with one of the resistors 222 and a respective pair of resistors 222 and a test pattern 210 is connected to a respective node between two resistors 221, starting with a node 223. Furthermore, each test pattern 210A ... 210N may be coupled to a respective resistor 280A ... 280N, each of which is with one terminal connected to the actual respective test pattern and which is connected with the other terminal to a further probe pad 240C. The resistance values of the respective resistors 280A ... 280N $R_k$ may be lower than the value R but may still be significantly higher than a corresponding resistance value of one of the respective test patterns 210A ... 210N when having a leakage current failure.

During operation of the test structure 200 as shown in FIG. 2f, the probe pad 240C may be supplied with a reference voltage, such as 5 volts DC, or any other appropriate value, indicated as VDD, while the probe pad 240B may serve as the ground potential, which may also be the reference for the voltage VDD and an output voltage obtained at the probe pad 240A. In this circuit arrangement, the respective test patterns 210A ... 210N may be considered as switches, which may apply the voltage VDD to the associated resistor 222 when a current leakage failure has not occurred, or which may apply the ground potential, when shunting the respective resistor 280A, to the respective resistor 222. In this way, the voltage detected at the probe pad 240A is determined by the digital value obtained by the respective status of the test patterns 210A ... 210N. That is, when no leakage current failure has occurred, the respective digital value or pattern would be "0, 0 ... 0" for the test patterns 210A ... 210N. If, for instance, a respective failure occurred in the last test pattern 210N, the respective digital value would be "0, 0 ... 1" producing a respective low voltage at the output pad 240A. Similarly, for any other digital pattern, a unique voltage may be obtained at the output pad 240A. Consequently, the network of resistors 220 may be considered as a "digital to analog" converter with respect to the status of the respective test patterns 210A ... 210N, which may represent the digital input value that generates the quasi analog output voltage at the probe pad 240A. Hence, a high degree of flexibility may be obtained since a moderately large number of test patterns may be simultaneously assessed on the basis of three probe pads. Moreover, since only three different resistance values, i.e., R, 2R and $R_k$, may be used, the respective circuit configuration for providing the respective resistors is moderately low.

Based on the measurement results obtained by the test structure 200, an appropriate evaluation of OPC characteristic may be achieved with respect to design parameter values and/or a process flow parameter value for one or more parameters for a specific device layer, such as a metallization structure, under consideration. A respective evaluation may further be used for improving the OPC model under consideration or determine one or more appropriate parameter values that may then be used for performing a process sequence in order to obtain respective device structures on a plurality of product substrates while using the evaluated OPC strategy.

As a result, the subject matter disclosed herein provides a test structure and a measurement technique which enable the assessment of OPC mechanisms with respect to a plurality of locally varying conditions. For this purpose, test patterns, possibly in combination with a resistor network, may be provided to estimate the leakage current behavior with a low number of probe pads. In illustrative embodiments, the leakage behavior of line features having opposing line end portions may be estimated for a critical tip-to-tip spacing for a plurality of process conditions. In some illustrative embodiments, a high degree of flexibility for testing process and design parameters may be achieved since the simultaneous occurrence of respective failures in test patterns may be uniquely determined so that the plurality of parameters may be monitored or controlled with a reduced number of probe pads. Thus, the quality of OPC models and other correction techniques may be efficiently evaluated on the basis of electric measurements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A test structure, comprising:
   a substrate;
   a plurality of test assemblies formed on said substrate on the basis of an optical proximity correction (OPC) process, each test assembly comprising a plurality of first line features and a plurality of second line features, said first and second line features comprising opposing end portions provided at a predefined tip-to-tip design distance and having a spatial design relationship for electrically insulating the plurality of first line features from the plurality of second line features, said spatial design relationship being defined by at least two design dimensions wherein members of said plurality of test assemblies comprise different combinations of values for said at least two design dimensions; and
   an interconnect structure formed above said substrate and connecting said plurality of test assemblies so as to identify a short current path in at least one of said test assemblies between said first and second line features of said at least one test assembly.

2. The test structure of claim 1, wherein one of said design dimensions comprises a width of said first and second line features, said width indicating a design width in a central portion of said first and second line features.

3. The test structure of claim 2, wherein one of said design dimensions comprises a distance between said second line features.

4. The test structure of claim 3, wherein members of said plurality of test assemblies comprise different combinations of values for said line width and a distance between said line features.

5. The test structure of claim 1, wherein said substrate represents a substrate for forming thereon semiconductor devices.

6. The test structure of claim 1, wherein said substrate represents a substrate for forming a lithography mask.

7. The test structure of claim 1, wherein said interconnect structure comprises a first probe pad and a second probe pad coupled to the plurality of test assemblies for access by an external measurement device.

8. The test structure of claim 7, wherein said test structure comprises not more than said first and second probe pads.

9. The test structure of claim 1, further comprising a network of a plurality of resistive components connected to said interconnect structure and said plurality of test assemblies.

10. The test structure of claim 9, wherein said network of resistive components is connected to indicate a single test assembly comprising a leakage fault.

11. The test structure of claim 9, wherein said network of resistive components is connected to concurrently indicate two or more test assemblies each comprising a leakage fault.

12. The test structure of claim 1, wherein said first and second line features represent device features of a metallization layer of a semiconductor device.

13. The test structure of claim 1, wherein said first and second line features represent gate electrodes of a semiconductor device.

14. The test structure of claim 7, further comprising a network of a plurality of resistive components connected to said interconnect structure, said first and second probe pads, and said plurality of test assemblies, wherein an equivalent resistance of said test structure defined between said first and second probe pads is modulated by fault states of said test assemblies.

15. The test structure of claim 14, wherein said modulated resistance identifies a particular test assembly having a leakage fault.

16. The test structure of claim 14, wherein said modulated resistance concurrently identifies two or more test assemblies each comprising a leakage fault.

* * * * *